(12) United States Patent
Jing et al.

(10) Patent No.: US 9,793,509 B2
(45) Date of Patent: Oct. 17, 2017

(54) PACKAGING APPARATUS

(71) Applicants: BOE Technology Group Co., Ltd., Beijing (CN); Hefei BOE Optoelectronics Technology Co., Ltd., Anhui (CN)

(72) Inventors: Yangkun Jing, Beijing (CN); Junwei Li, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 133 days.

(21) Appl. No.: 14/741,555

(22) Filed: Jun. 17, 2015

(65) Prior Publication Data
US 2016/0226020 A1 Aug. 4, 2016

(30) Foreign Application Priority Data
Jan. 30, 2015 (CN) .......................... 2015 1 0050906

(51) Int. Cl.
*H01L 51/52* (2006.01)
*H01L 51/56* (2006.01)
(Continued)

(52) U.S. Cl.
CPC .......... *H01L 51/5253* (2013.01); *B29C 43/18* (2013.01); *B29K 2105/256* (2013.01); *H01L 51/5237* (2013.01); *H01L 51/56* (2013.01)

(58) Field of Classification Search
CPC ...... B29C 43/00; H01L 51/56; H01L 51/5253
(Continued)

(56) References Cited

U.S. PATENT DOCUMENTS 5,369,246 A * 11/1994 Nanos ..................... B32B 37/06
156/322

FOREIGN PATENT DOCUMENTS

CN  101295751 A * 10/2008 ....... H01L 21/67092
CN  103454799 A * 12/2013 ......... H01L 21/6838
(Continued)

OTHER PUBLICATIONS

Walczyk, D. J. Manuf. Sci. Eng. 131(2), 021009, Mar 27, 2009.*
(Continued)

*Primary Examiner* — Philip Tucker
*Assistant Examiner* — Jimmy R Smith, Jr.
(74) *Attorney, Agent, or Firm* — Westman, Champlin & Koehler, P.A.

(57) ABSTRACT

Embodiments of the present invention provide a packaging apparatus, which relates to a preparing field of display technology and can solve a problem of the poor bonding state between a packaging cover plate and a substrate to be packaged, improving a quality of assembled product. The packaging apparatus comprises: an upper sealing unit and a lower sealing unit which have recesses and are movable towards each other to engage and form a cavity, wherein upper suction columns for fixing a packaging cover plate is disposed inside the recess of the upper sealing unit and a bearing table for bearing a substrate to be packaged is disposed inside the recess of the lower sealing unit, and seal glue is disposed on a face of the substrate to be packaged facing the packaging cover plate; a suction mechanism for vacuumizing the cavity; a leveling mechanism for adjusting a levelness of the packaging cover plate and/or the substrate to be packaged; a displacing mechanism for driving the packaging cover plate and/or the substrate to be packaged to move towards each other so that the packaging cover plate
(Continued)

contacts the seal glue; an inflation mechanism for filling gas into the cavity after vacuumizing.

20 Claims, 5 Drawing Sheets

(51) Int. Cl.
*B29C 43/18* (2006.01)
*B29K 105/00* (2006.01)

(58) Field of Classification Search
USPC ..... 156/228, 580, 581, 583.1, 583.6, 583.91
See application file for complete search history.

(56) References Cited

FOREIGN PATENT DOCUMENTS

| CN | 103872264 A | 6/2014 |
| JP | 2012-230255 A | 11/2012 |
| KR | 10-0819496 B1 | 3/2008 |
| KR | 100819496 B1 * | 4/2008 |
| KR | 10-2012-0083686 A | 7/2012 |
| KR | 10-2012-0083871 A | 7/2012 |

OTHER PUBLICATIONS

Machine translation of KR100819496.*
Machine translation of CN101295751.*
Machine translation of CN103454799.*
First Office Action, including Search Report, for Chinese Patent Application No. 201510050906.9, dated May 5, 2016, 13 pages.

* cited by examiner

PACKAGING APPARATUS

CROSS-REFERENCE TO RELATED APPLICATION

This application claims the benefit of Chinese Patent Application No. 201510050906.9 filed on Jan. 30, 2015 in the State Intellectual Property Office of China, the whole disclosure of which is incorporated herein by reference.

BACKGROUND OF THE INVENTION

Field of the Invention

The present invention relates to a preparing field of display technology, in particular, to a packaging apparatus.

Description of the Related Art

An OLED (Organic Light-Emitting Diode) display technology has become a mainstream trend of display technology due to its characteristic of self-illumination.

During the preparation process of an OLED display device, a display substrate on which OLED components are formed, that is, a substrate to be packaged, is required to be packaged with a prepared packaging cover plate by a packaging apparatus, in order to form a display device.

At present, there are mainly following disadvantages in the existing packaging apparatus that positions of the packaging cover plate or the substrate to be packaged are inclined when they are fed into the packaging apparatus or subjected to uneven forces during pressing process, which causes the packaging cover plate to be in a poor bonding relation with the substrate to be packaged after pressing, and ambient air thereby tends to enter an interior of the OLED display device through a region in which a seal glue is in a poor bonding relation with the cover plate. Thus, an useful life of the OLED components is affected disadvantageously, and a quality of the assembled OLED display device is reduced.

SUMMARY OF THE INVENTION

In order to solve the above disadvantages in the prior art, embodiments of the present invention provide a packaging apparatus, which is able to solve the problem that the bonding state between the packaging cover plate and the substrate to be packaged becomes poor after being pressed, which is resulted from the inclined position of the packaging cover plate or the substrate to be packaged or from the uneven forces applied on them during the pressing process, and improve the quality of assembled cover plate and substrate.

To achieve the object described above, the embodiments of the present invention propose solutions as below:

The embodiment of the present invention provides a packaging apparatus, comprising:

an upper sealing unit and a lower sealing unit, each having a recess and is movable towards the other to engage and form a cavity, wherein upper suction columns for fixing a packaging cover plate are disposed inside the recess of the upper sealing unit and a bearing platform for bearing a substrate to be packaged is disposed inside the recess of the lower sealing unit, and seal glue is disposed on a face of the substrate to be packaged facing the packaging cover plate;

a suction mechanism for vacuumizing the cavity;

a leveling mechanism for adjusting a levelness of the packaging cover plate and/or the substrate to be packaged;

a displacing mechanism for driving the packaging cover plate and/or the substrate to be packaged to move towards each other so that the packaging cover plate contacts the seal glue;

an inflation mechanism for filling gas into the cavity after vacuumizing.

Preferably, the lower sealing unit is stationary relative to the upper sealing unit; the packaging apparatus further comprises a first driving unit located at a side of the upper sealing unit away from the recess, the first driving unit is used to drive the upper sealing unit to engage with the lower sealing unit to form the cavity.

Preferably, the upper sealing unit further comprises an upper heating disk located in the recess; wherein, the packaging cover plate is located at a side of the upper heating disk facing the lower sealing unit, and vertical movement of the upper heating disk causes vertical movement of the packaging cover plate.

Preferably, the upper suction columns can move through the upper heating disk in the vertical direction; a suction disk is disposed at a side of the upper suction column away from the upper heating disk and is used to fix the packaging cover plate conveyed to a region between the upper and lower sealing units.

Preferably, the recess of the upper sealing unit consists of an upper recess bottom and upper side walls around the upper recess bottom; the packaging apparatus further comprises:

a supporting platform of the upper suction column located at a side of the upper sealing unit away from the recess and passing along the first driving unit;

a second driving unit driving the supporting platform of the upper suction column to move in the vertical direction;

wherein the upper suction column passes through the upper recess bottom to connect with the supporting platform of the upper suction column and its height is larger than a height of the upper side wall.

Preferably, the packaging apparatus further comprises:

a supporting platform of the upper heating disk located inside the upper recess bottom and passing through the upper suction column;

the displacing mechanism comprises:

a third driving unit driving the supporting platform of the upper heating disk to move in the vertical direction and passing through the supporting platform of the upper suction column and the upper recess bottom;

supporting columns of the upper heating disk connecting the supporting platform of the upper heating disk with the upper heating disk.

Preferably, the bearing platform comprises a lower heating disk fixed in the recess; wherein the substrate to be packaged is located at a side of the lower heating disk facing the upper sealing unit.

Preferably, the packaging apparatus further comprises lower suction columns which can move through the lower heating disk in the vertical direction; the lower suction columns carry the substrate to be packaged conveyed to the region between the upper and lower sealing units.

Preferably, the recess of the lower sealing unit consists of a lower recess bottom and lower side walls around the lower recess bottom; the packaging apparatus further comprises: a supporting platform of the lower suction column located at a side of the lower sealing unit away from the recess, and a fourth driving unit driving the supporting platform of the lower suction column to move in the vertical direction; wherein, the lower suction column passes through the lower recess bottom to connect with the supporting platform of the lower suction column and its height is larger than a height of the lower side wall.

Preferably, the leveling mechanism comprises an upper leveling unit; the upper leveling unit is located between the upper suction column and the suction disk and comprises an upper levelness adjusting layer and an upper piezoelectric sensing layer with the upper levelness adjusting layer located next to the ends of the upper suction column.

Preferably, the leveling mechanism comprises a lower leveling unit; the lower leveling unit is located at a side of the lower suction column away from the recess and comprises a lower levelness adjusting layer, a lower piezoelectric sensing layer and a surface suction layer positioned in sequence with the lower levelness adjusting layer next to the ends of the lower suction column.

Preferably, in a state that the packaging cover plate and the substrate to be packaged have a structure of curved surface, each upper suction column comprises a plurality of suction sub-columns with different heights which match with a curvature of the packaging cover plate; and the bearing platform comprises a plurality of bearing sub-columns with different heights which match with a curvature of the substrate to be packaged.

Preferably, the packaging apparatus further comprises:

a silicone rubber upper heating disk at the ends of the suction sub-columns facing the bearing sub-column; and/or a silicone rubber lower heating disk at the ends of the bearing sub-columns facing the suction sub-column.

Preferably, the packaging apparatus further comprises a temperature control unit connected to the upper heating disk and/or the lower heating disk.

Preferably, a seal ring is disposed in a region where the upper sealing unit engages with the lower sealing unit.

Preferably, the packaging apparatus further comprises an ultraviolet lamp source; wherein an ultraviolet light emitted from the ultraviolet lamp source passes through the upper sealing unit to illuminate on the packaging cover plate.

Therefore, during pressing the packaging cover plate and the substrate to be packaged, in virtue of the packaging apparatus according to the embodiments of the present invention, on one hand, the levelness of the packaging cover plate and/or the substrate to be packaged before being pressed is maintained by using the leveling mechanism to adjust their levelness, so as to avoid the problem in the prior art that the bonding state between the packaging cover plate and the substrate to be packaged becomes poor after being pressed, which is caused by the inclined position(s) of the packaging cover plate and/or the substrate to be packaged in the prior art. On the other hand, the inflation mechanism is used to fill a certain amount of gas into the cavity, so that the packaging cover plate and the substrate to be packaged in the cavity are under a certain pressure, and the packaging cover plate will contact and press the seal glue on the substrate to be packaged completely and evenly with the characteristic of balance, evenness and orthogonality to the substrate surface of gas pressing. Thus the problem in the prior art that the bonding state between the packaging cover plate and the substrate to be packaged becomes poor after be pressed, which is resulted from the uneven forces applied on them during the pressing process, is avoided. Therefore, after assembling the packaging cover plate and the substrate to be packaged with the above packaging apparatus according to the embodiments of the present invention, the production quality of formed display panel is improved.

BRIEF DESCRIPTION OF THE DRAWINGS

In order to illustrate the technical solution of the prior art or embodiments of the present invention more clearly, a simply introduction about the drawings of the prior art or the embodiments will be made in the following, and obviously, the drawings described later relate to only some embodiments of the present invention. Other drawings will also be obtained by those skilled in the art without any creative effort according to these drawings.

LIST OF REFERENCE NUMERALS

01—packaging apparatus, 01a—cavity, 02—packaging cover plate, 03—substrate to be packaged, 04—seal glue, 10—upper sealing unit, 101—recess of upper sealing unit, 101a—upper recess bottom, 101b—upper side wall, 11—upper suction column, 110—suction sub-column, 12—first driving unit, 13—upper heating disk, 130—silicone rubber upper heating disk, 14—supporting platform of upper suction column, 15—second driving unit, 16—supporting platform of upper heating disk, 17—third driving unit, 18—supporting column of upper heating disk, 19—seal ring, 20—lower sealing unit, 201—recess of lower sealing unit, 201a—lower recess bottom, 201b—lower side wall, 21—bearing platform, 210—bearing sub-platform, 22—lower heating disk, 220—silicone rubber lower heating disk, 23—lower suction column, 24—supporting platform of lower suction column, 25—fourth driving unit, 30—suction mechanism, 40—leveling mechanism, 50—displacing mechanism, 60—inflation mechanism, 70—ultraviolet lamp source.

DETAILED DESCRIPTION OF PREFERRED EMBODIMENTS OF THE INVENTION

The embodiments of the present invention will be described clearly and completely hereinafter in conjunction with the drawings. Obviously, the followings are merely a part of, rather all of, the embodiments of the present invention. Based on the following embodiments, all the other embodiments obtained by those skilled in the art without any creative effort also fall in the scope of the present invention.

It should be noted that the terms "upper", "lower", "inner" and "outer" are used herein merely to explain the embodiments of the present invention with reference to the drawings and not used as limitations.

Figure 1A:
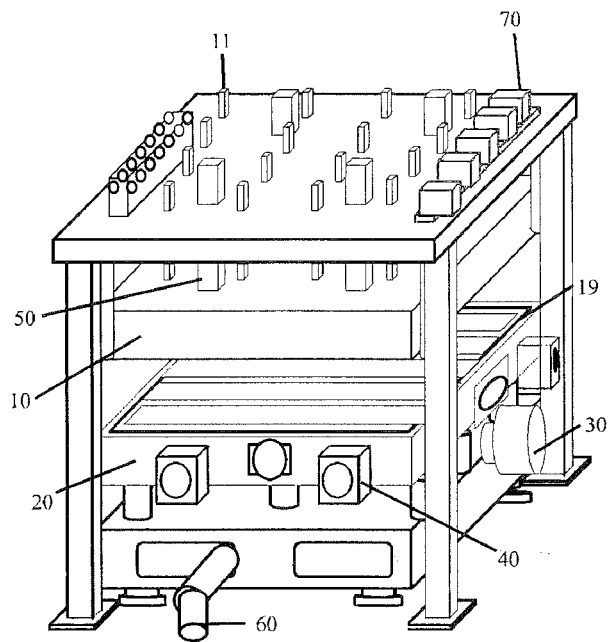
FIG. 1a is a structural schematic perspective view of a packaging apparatus according to an embodiment of the present invention.
Figure 1B:
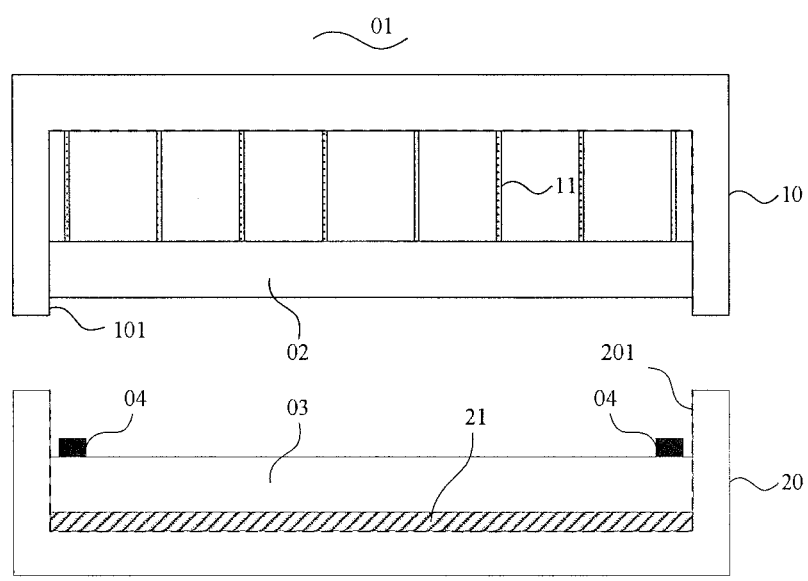
FIG. 1b is a first structural schematic partial section view of the packaging apparatus according to an embodiment of the present invention.

The embodiment of the present invention provides a packaging apparatus 01 as shown in FIG. 1a and FIG. 1b, the packaging apparatus 01 comprises:

an upper sealing unit 10 and a lower sealing unit 20 which both have recesses and are movable towards each other to engage and form a cavity 01a (not indicated in both FIG. 1a and FIG. 1b); wherein, upper suction columns 11 for fixing a packaging cover plate 02 are disposed inside the recess 101 of the upper sealing unit and a bearing platform 21 for bearing a substrate 03 to be packaged is disposed inside the recess 201 of the lower sealing unit; and seal glue 04 is disposed on a face of the substrate 03 to be packaged facing the packaging cover plate 02; a suction mechanism 30 for vacuumizing the cavity 01a; a leveling mechanism 40 for adjusting a levelness of the packaging cover plate 02 and/or the substrate 03 to be packaged; a displacing mechanism 50 for driving the packaging cover plate 02 and/or the substrate 03 to be packaged to move towards each other so that the packaging cover plate 02 contacts the seal glue 04; an inflation mechanism 60 for filling gas into the cavity 01a after vacuumizing.

Figure 2:
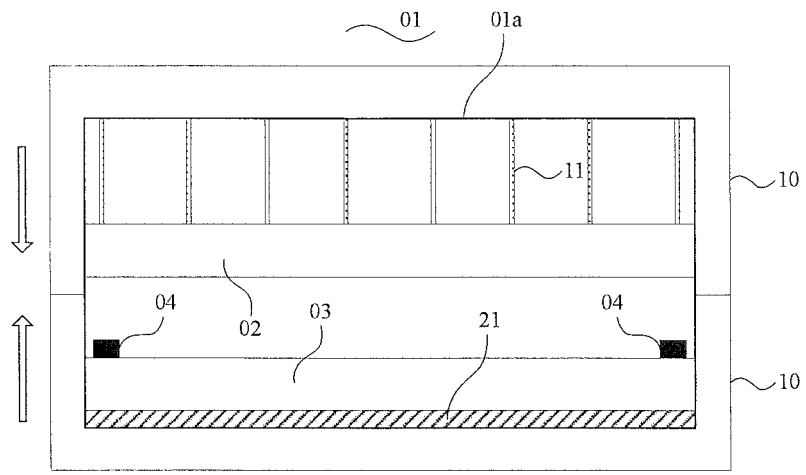
FIG. 2 is a structural schematic view of a cavity formed by engaging the upper sealing unit with the lower sealing unit in the packaging apparatus according to an embodiment of the present invention.

It should be noted that, firstly, as shown in FIG. 2, the upper sealing unit 10 and the lower sealing unit 20 are movable towards each other to engage and form a cavity 01a, which is to mean that, the upper sealing unit 10 is stationary and the lower sealing unit 20 is driven to move towards and to engage with the upper sealing unit 10, so as to form a hermetic space, i.e. the cavity 01a; alternatively, the lower sealing unit 20 is stationary and the upper sealing unit 10 is drived to move towards and to engage with the lower sealing unit 20, so as to form the cavity 01a; alternatively, of course, the upper sealing unit 10 may move towards the lower sealing unit 20 while the lower sealing unit 20 may also move towards the upper sealing unit 10, the cavity 01a is formed after the upper sealing unit 10 engages with the lower sealing unit 20.

Further, a seal ring 19 is disposed in a region where the upper sealing unit 10 engages with the lower sealing unit 20, as shown in FIG. 1a, in order to obtain a higher hermetic cavity 01a formed by engaging the upper sealing unit 10 with the lower sealing unit 20.

Here, the seal ring 19 may be designed to be secured in a engaged region on the upper sealing unit 10 corresponding to the lower sealing unit 20, or may also be designed to be secured in a engaged region on the lower sealing unit 20 corresponding to the upper sealing unit 10 as shown in FIG. 1a.

Secondly, the amount of the upper suction columns 11 can be set flexibly according to parameters such as an area, mass of the packaging cover plate 02 while considering the stability when the upper suction columns 11 secure the packaging cover plate 02. Preferably, the upper suction columns 11 are evenly distributed relative to the packaging cover plate 02.

Thirdly, referring to FIG. 1 and FIG. 2, because the packaging cover plate 02 and the substrate 03 to be packaged are securely carried by the upper suction columns 11 and the bearing platform 21, respectively, the leveling mechanism may adjust the levelness of the packaging cover plate 02 and/or the substrate 03 to be packaged by adjusting the suction contacting level between the upper suction columns 11 and the packaging cover plate 02 and/or by adjusting the levelness of the bearing platform 21.

Figure 3:
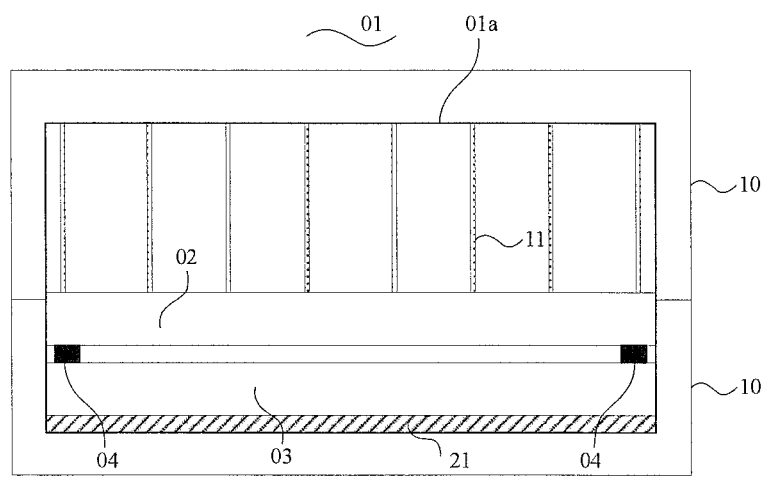
FIG. 3 is a schematic view illustrating a movement towards to each other of the packaging cover plate and the substrate to be packaged in the packaging apparatus according to an embodiment of the present invention.

Similarly, as shown in FIG. 3, the displacing mechanism may drive the upper suction columns 11 and the bearing platform 21 contacting the packaging cover plate 02 and the substrate 03 to be packaged, respectively, so as to drive the packaging cover plate 02 and/or the substrate 03 to be packaged to move towards each other, so that the packaging cover plate 02 contacts the seal glue 04 on the substrate 03 to be packaged.

Here, the opposite movement between the packaging cover plate 02 and/or the substrate 03 to be packaged may be that, for example, the packaging cover plate 02 is stationary relative to the packaging apparatus 01, and the substrate 03 to be packaged moves towards the packaging cover plate 02; alternatively, the substrate 03 to be packaged is stationary relative to the packaging apparatus 01, and the packaging cover plate 02 moves towards the substrate 03 to be packaged; alternatively, of course, the packaging cover plate 02 moves towards the substrate 03 to be packaged while the substrate 03 to be packaged moves towards the packaging cover plate 02 to realize the engagement therebetween.

Fourthly, the suction mechanism for vacuumizing the cavity 01a may comprise a gas channel communicated with the cavity 01a and a vacuum pump, and the specific structure thereof may employ the existing suction mechanism and the embodiments of the present invention are not limited to this.

Fifthly, the inflation mechanism fills a certain amount of gas into the vacuumized cavity 01a to increase the pressure in the cavity 01a, and the filled gas will enclose evenly around the packaging cover plate 02 and the substrate 03 to be packaged, so that the packaging cover plate 02 and the substrate 03 to be packaged are evenly forced upwards and downwards when being pressed, and thereby mitigating the problem that the bonding state between the packaging cover plate 02 and the substrate 03 to be packaged becomes poor after being pressed, which is caused by the uneven forces applied on them during the pressing process.

Based on the above, when the packaging cover plate 02 and the substrate 03 to be packaged being pressed in virtue of the packaging apparatus 01 above according to the embodiments of the present invention, on one hand, the levelness of the packaging cover plate 02 and/or the substrate 03 to be packaged before being pressed is maintained by using the leveling mechanism to adjust the levelness, so as to avoid the problem in the prior art that the bonding state between the packaging cover plate 02 and the substrate 03 to be packaged becomes poor after being pressed, which is caused by the inclined position(s) of the packaging cover plate 02 and/or the substrate 03 to be packaged in the prior art; on the other hand, the inflation mechanism is used to fill a certain amount of gas into the cavity 01a, so that the packaging cover plate 02 and the substrate 03 to be packaged in the cavity 01a are under a certain pressure, the packaging cover plate 02 will contact and press the seal glue 04 on the substrate 03 to be packaged completely and evenly with the characteristic of balance, evenness and orthogonality to the substrate surface of gas pressing, avoiding the problem in the prior art that the bonding state between the packaging cover plate 02 and the substrate 03 to be packaged becomes poor after be pressed, which is resulted from the uneven forces applied on them during the pressing process, so as to improve the production quality of display panel formed after the packaging cover plate 02 and the substrate 03 to be packaged being assembled with the packaging apparatus 01 above of the embodiments of the present invention.

Figure 4:
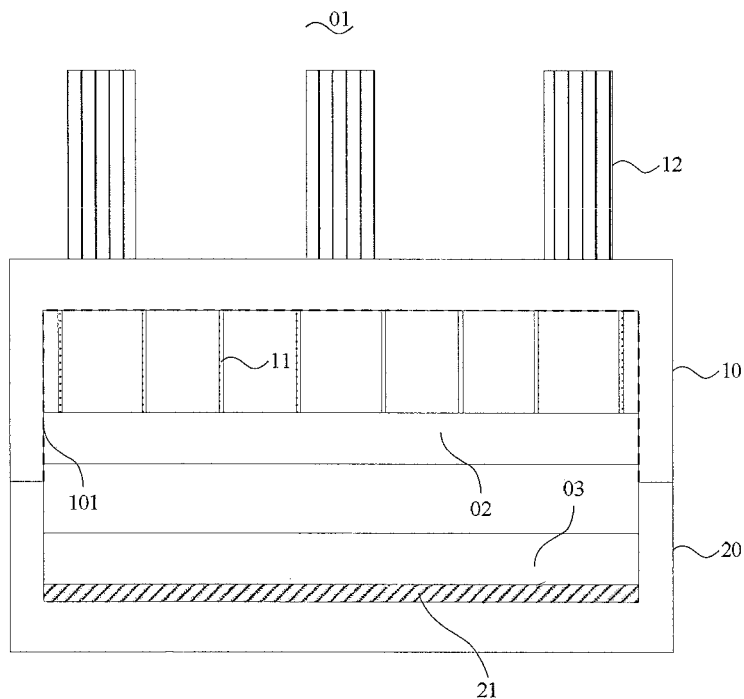
FIG. 4 is a second structural schematic partial section view of the packaging apparatus according to an embodiment of the present invention.

Based on the above, in order to simplify the pressing process in which the packaging cover plate 02 and the substrate 03 to be packaged are pressed with the above packaging apparatus 01, in the preferable embodiment of the present invention, the lower sealing unit 20 is stationary relative to the upper sealing unit 10. Therefore, as shown in FIG. 4, the packaging apparatus 01 further comprises: a first driving unit 12 located at a side of the upper sealing unit 10 away from the recess 101, the first driving unit 12 is used to drive the upper sealing unit 10 to engage with the lower sealing unit 20 to form the cavity 01*a*.

Here, the first driving unit 12 may comprise, for example, a piston rod. The first driving unit 12 may linearly reciprocate through being directed by a cylinder, so that the first driving unit 12 may bring the upper sealing unit 10 to move towards the lower sealing unit 20 and thereby the upper sealing unit 10 engages with the lower sealing unit 20 to form the cavity 01*a*; similarly, the first driving unit 12 may also bring the upper sealing unit 10 to separate from the lower sealing unit 20 and thereby the formed cavity 10 is opened, and then the pressed packaging cover plate 02 and the substrate 03 to be packaged may be taken out.

Further, the seal glue 04 on the substrate 03 to be packaged is typically a thermoset glue containing a thermoset agent, that is, if the seal glue 04 is in a heated state, the oligomer epoxy group in the seal glue will react to be cured by a thermoset effect, so that the packaging cover plate 02 to contact the seal glue 04 and the substrate 03 to be packaged are pressed and fixed together.

Figure 5:
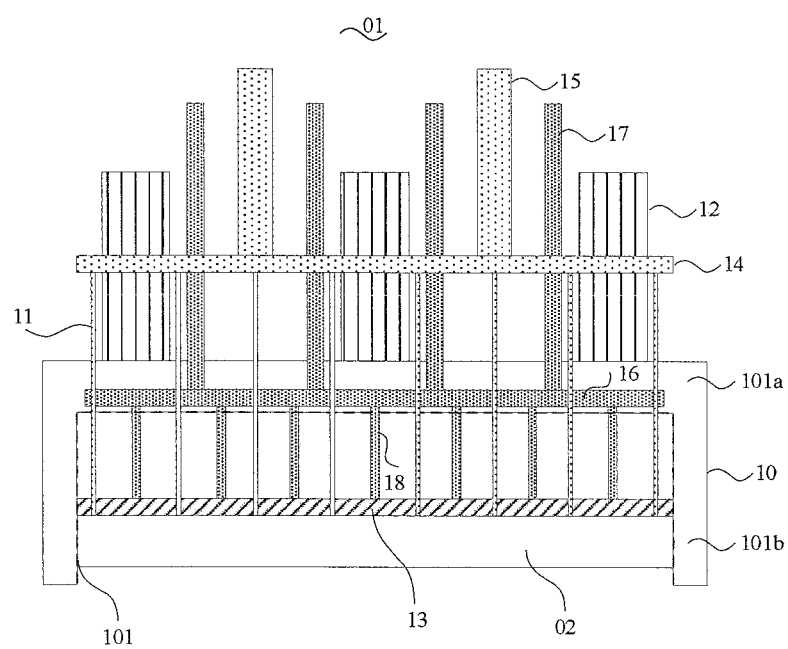
FIG. 5 is a third structural schematic partial section view of the packaging apparatus according to an embodiment of the present invention.

Thus, a mechanism for heating the packaging cover plate 02 is also disposed in the above packaging apparatus 01. In particular, as shown in FIG. 5, the upper sealing unit 10 further comprises an upper heating disk 13 in the recess 101. The packaging cover plate 02 is located at a side of the upper heating disk 13 facing the lower sealing unit, and vertical movement of the upper heating disk 13 causes vertical movement of the packaging cover plate 02.

It should be noted that, firstly, the upper heating disk 13 may consist of a plurality of sheet heating strips arranged in parallel and a circuit board, for example. Compared with a conventional wire electric heating element, the sheet heating strip may provide more even thermal field, a shorter heating up time and response time, a lower power load and a longer useful life.

Secondly, because the packaging cover plate 02 is located at a side of the upper heating disk 13 facing the lower sealing unit, the upper heating disk 13 brings the packaging cover plate 02 to move in the vertical direction and to move it towards the substrate 03 to be packaged, so that after the packaging cover plate 02 contacts the seal glue 04 on the substrate 03 to be packaged, the heat is transferred to the seal glue 04 by heating the packaging cover plate 02 and thereby the fixed connection between the two substrates is completed.

The suction columns 11 for fixing the packaging cover plate 02 are disposed in the recess 101 of the upper sealing unit, and the packaging cover plate 02 is located at a side of the upper heating disk 13 facing the lower sealing unit after entering the recess 101 of the upper sealing unit 10 by a conveying device such as manipulator. Thus, in order to facilitate that the upper suction columns 11 grip and fix the packaging cover plate 02, further referring to FIG. 5, the upper suction columns 11 can move through the upper heating disk 13 in the vertical direction; a suction disk is disposed at a side of the upper suction columns 11 away from the upper heating disk 13 and is used to fix the packaging cover plate 02 conveyed to a region between the upper and lower sealing units 10, 20.

It should be noted that corresponding hollow regions may be disposed on the upper heating disk 13 so that the upper suction columns 11 pass through the upper heating disk 13 to move in the vertical direction.

Figure 6:
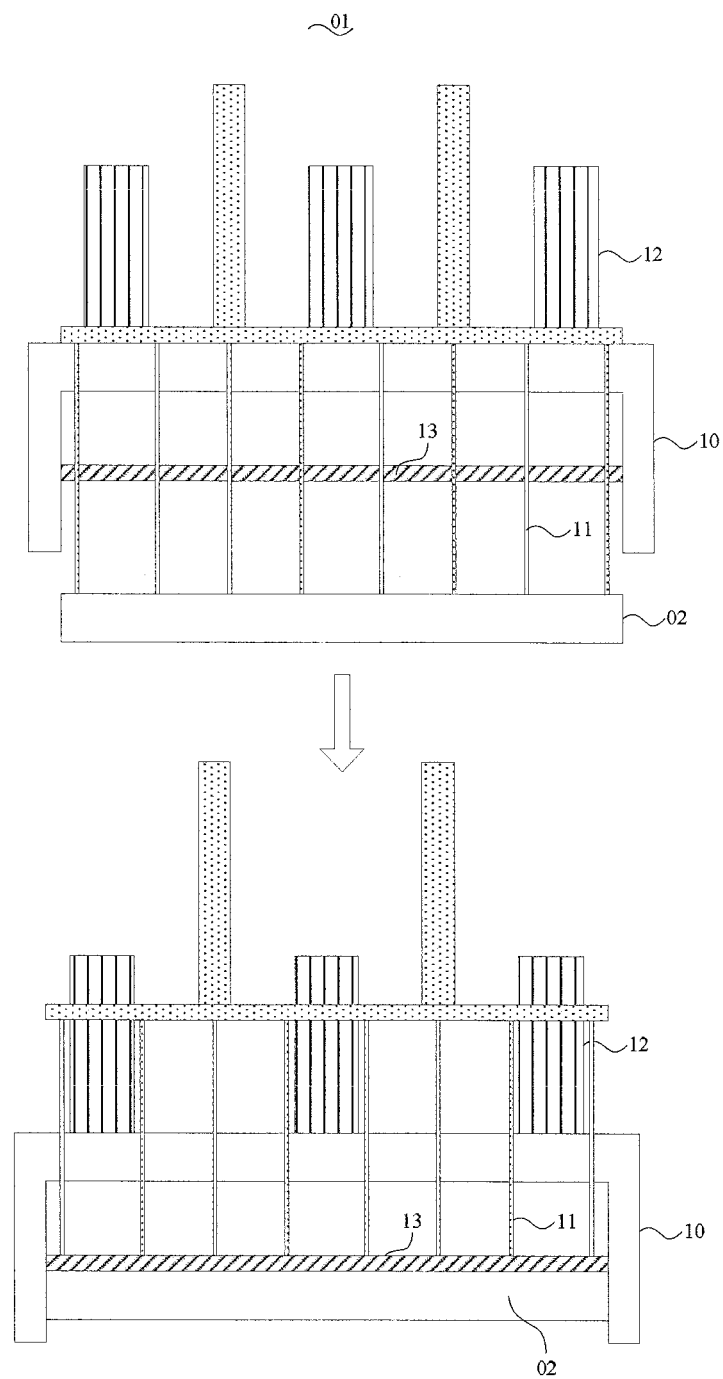
FIG. 6 is a fourth structural schematic partial section view of the packaging apparatus according to an embodiment of the present invention.

Here, as shown in FIG. 6, the upper sealing unit 10 is located above the lower sealing unit 20, and the substrate, such as the packaging cover plate 02, is required to be gripped by a corresponding mechanism after conveyed into the region between the upper sealing unit 10 and the lower sealing unit 20 by a conveying device such as manipulator. Thus, in the packaging apparatus 01 provided by the embodiments of the present invention, the upper suction columns 11 can move through the upper heating disk 13 in the vertical direction so as to grip the packaging cover plate 02.

Based on the above, since the upper suction columns 11 are located above the packaging cover plate 02, in order to prevent the packaging cover plate 02 from falling due to the gravity, a suction disk made from, for example, silica gel, is disposed at a side of the upper suction column 11 away from the heating disk 13 for gripping the packaging cover plate 02 conveyed into the region between the upper sealing unit 10 and the lower sealing unit 20 more firmly.

Based on the above, as shown in FIG. 5, the recess 101 of the upper sealing unit 10 consists of an upper recess bottom 101*a* and upper side walls 101*b* around the upper recess bottom 101*a*. The packaging apparatus 01 further comprises: a supporting platform 14 of the upper suction column located at a side of the upper sealing unit 10 away from the recess 101 and passing along the first driving unit 12; a second driving unit 15 driving the supporting platform 14 of the upper suction column to move in the vertical direction; wherein the upper suction column 11 passes through the upper recess bottom 101*a* to connect with the supporting platform 14 of the upper suction column and its height is larger than a height of the upper side wall 101*b*.

It should be noted that, the second driving unit 15 may comprise, for example, a piston rod. The second driving unit 15 may linearly reciprocate through being directed by a cylinder, so that the second driving unit 15 may bring the supporting platform 14 of the upper suction column to move in the vertical direction. Because the supporting platform 14 of the upper suction column is connected with the upper suction column 11, the reciprocation in the vertical direction of the upper suction column 11 is realized, that is, the fixing of the packaging cover plate 02 conveyed into the region between the upper sealing unit 10 and the lower sealing unit 20 is completed.

Moreover, the height of the upper suction column 11 is larger than that of the upper side wall 101*b*, so that the upper suction column 11 can extend out of a plane where a terminal of the upper side wall 101*b* is located, to facilitate gripping the packaging cover plate 02.

Further, the packaging cover plate 02 is located at a side of the upper heating disk 13 facing the lower sealing unit and the upper heating disk 13 brings the packaging cover plate 02 to move in the vertical direction. Thus, as shown in FIG. 5, the packaging apparatus 01 further comprises: a supporting platform 16 of the upper heating disk located inside the upper recess bottom 101*a* and passing through the upper suction column 11. The displacing mechanism 50 comprises: a third driving unit 17 driving the supporting platform 16 of the upper heating disk to move in the vertical direction and passing through the supporting platform 14 of the upper suction column and the upper recess bottom 101*a*;

supporting columns 18 of the upper heating disk connecting the supporting platform 16 of the upper heating disk with the upper heating disk 13.

Here, the third driving unit 17 may comprise, for example, a piston rod. The third driving unit 17 may linearly reciprocate through being directed by a cylinder, so that the supporting platform 16 of the upper heating disk brings the upper heating disk 13 to move in the vertical direction through supporting columns 18 of the upper heating disk.

Figure 7:
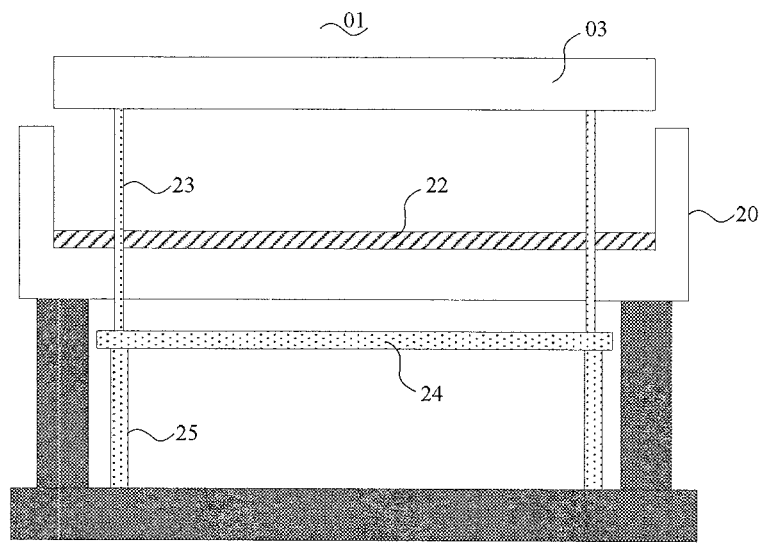
FIG. 7 is a fifth structural schematic partial section view of the packaging apparatus according to an embodiment of the present invention.

Based on the above, in order to heat the seal glue evenly, as shown in FIG. 7, the bearing platform comprises a lower heating disk 22 fixed in the recess 201, the substrate 03 to be packaged is located at a side of the lower heating disk 22 facing the upper sealing unit.

Here, the lower heating disk 22 heats the substrate 03 to be packaged, so that the seal glue 04 is evenly heated by the packaging cover plate 02 and the substrate 03 to be packaged located at upside and downside thereof respectively to be cured. The specific structure of the lower heating disk 22 may refer to that of the upper heating disk 13, and it is omitted here.

Based on the above, in order to better control the heating degree of the packaging cover plate 02 by the upper heating disk 13 and/or that of the substrate 03 to be packaged by the lower heating disk 22, the packaging apparatus 01 further comprises a temperature control unit connected to the upper heating disk 13 and/or the lower heating disk 22.

For example, if the temperature control unit is connected to the upper heating disk 13, the temperature control unit may comprise at least one temperature sensor for monitoring the temperature of the packaging cover plate 02, a control unit (in particular, may comprise a programmable logic unit, a controller, etc.) receiving a signal from the temperature sensor, and an executing unit receiving a command from the control unit and controlling the upper heating disk 13. Here, the executing unit specifically refers to a switch, preferably, a solid state high speed relay switch, which is used to open or close the upper heating disk 13 quickly and precisely.

Further, when conveying a substrate such as the substrate 03 to be packaged by a conveying device such as manipulator, typically, the conveying device can only convey the substrate 03 to be packaged into the region between the upper sealing unit 10 and the lower sealing unit 20 and is difficult to place directly the substrate 03 to be packaged into the recess 201 of the lower sealing unit because the lower sealing unit 20 has a recess. Thus, further preferably, as shown in FIG. 7, the packaging apparatus 01 further comprises lower suction columns 23 which can move through the lower heating disk 22 in the vertical direction. The lower suction columns 23 carry the substrate 03 to be packaged conveyed to the region between the upper and lower sealing units 10, 20.

Further, as shown in FIG. 7, the recess 201 of the lower sealing unit particularly consists of a lower recess bottom 201a and lower side walls 201b around the lower recess bottom 201a. Based on this, the lower suction columns 23 can pass through the lower heating disk 22 to move in the vertical direction, which is achieved by the following structures. Namely, the packaging apparatus 01 further comprises: a supporting platform 24 of the lower suction column located at a side of the lower sealing unit 20 away from the recess, and a fourth driving unit 25 driving the supporting platform 24 of the lower suction column to move in the vertical direction. The lower suction column 23 passes through the lower recess bottom 201a to connect with the supporting platform 24 of the lower suction column and its height is larger than a height of the lower side wall 201b.

It should be noted that, firstly, of course, the above packaging apparatus 01 may further comprise a mechanism such as a base supporting the lower sealing unit 20, so that there is a sufficient space inside the packaging apparatus 01 for driving the supporting platform 24 of the lower suction column to be moved by the fourth driving unit 25.

Secondly, the fourth driving unit 25 may comprise, for example, a piston rod. The fourth driving unit 25 may linearly reciprocate through being directed by a cylinder, so that the supporting platform 24 of the lower suction column reciprocates in the vertical direction.

Thirdly, the height of the lower suction column 23 is larger than that of the lower side wall 201b, so that the lower suction column can extend out of a plane where a terminal of the lower side wall 201b is located for carrying the substrate 03 to be packaged.

Based on the above, in particular, the leveling mechanism 40 for adjusting the levelness of the packaging cover plate 02 and/or the substrate 03 to be packaged comprises, an upper leveling unit located between the upper suction column 11 and the suction disk and comprising an upper levelness adjusting layer and an upper piezoelectric sensing layer away from the upper suction column 11 in order.

Here, the upper piezoelectric sensing layer generates a pressure sensing current corresponding to the pressure between the packaging cover plate 02 and the suction disk by contacting the suction disk, then the current is transferred to a corresponding control circuit, the control circuit applies an electric field corresponding to the pressure sensing current on the upper levelness adjusting layer, so that the upper levelness adjusting layer generates a deformation matching with a corresponding region of the packaging cover plate 02, the levelness of the packaging cover plate 02 is thus adjusted by changing a contact area between the suction disk and the packaging cover plate 02.

Further, the leveling mechanism 40 may also comprises a lower leveling unit. The lower leveling unit is located at a side of the lower suction column 23 away from the recess and comprises a lower levelness adjusting layer, a lower piezoelectric sensing layer and a surface suction layer away from the lower suction column 23 in order.

Here, the surface suction layer is located at the uppermost end of the lower suction column 23, that is, at a side contacting the substrate to be packaged. The lower piezoelectric sensing layer generates a pressure sensing current corresponding to the pressure between the substrate 03 to be packaged and the surface suction layer by contacting the surface suction layer, then the current is transferred to a corresponding control circuit, the control circuit applies an electric field corresponding to the pressure sensing current on the lower levelness adjusting layer, so that the lower levelness adjusting layer generates a deformation matching with a corresponding region of the substrate 03 to be packaged, the levelness of the substrate 03 to be packaged is thus adjusted by changing a contact area between the surface suction layer and the substrate 03 to be packaged.

Figure 8:
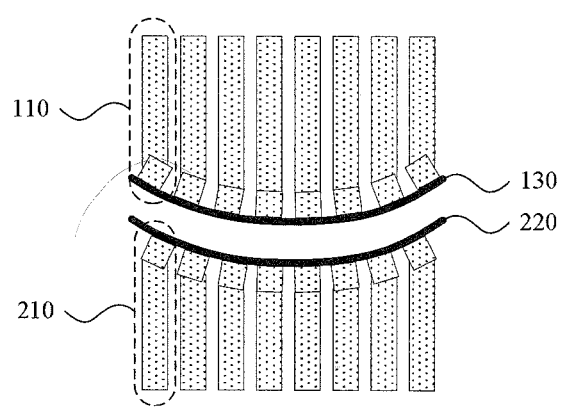
FIG. 8 is a sixth structural schematic partial section view of the packaging apparatus according to an embodiment of the present invention.

Based on the above, in a state that the packaging cover plate 02 and the substrate 03 to be packaged have a structure of curved surface, that is, a display panel formed by pressing the packaging cover plate 02 and the substrate 03 to be packaged is a curved display panel, in this case, as shown in FIG. 8, the upper suction column comprises a plurality of suction sub-columns 110 with different heights which match with a curvature of the packaging cover plate 02; and the bearing platform comprises a plurality of bearing sub-columns 210 with different heights which match with a curvature of the substrate 03 to be packaged.

Here, the plurality of sub suction columns 110 with different heights each may be adjusted by a computer or by hand before the packaging cover plate 02 and the substrate 03 to be packaged are pressed, or may also be adjusted in real time when the packaging cover plate 02 and the substrate 03 to be packaged are pressed, so that the application range of packaging apparatus above according to the embodiments of the present invention can be expanded to a field of pressing and packaging a 3D curved panel, and the value of the practical application of the packaging apparatus above is further increased.

Based on the above, in order to heat the packaging cover plate 02 and/or the substrate 03 to be packaged with curved structure, the packaging apparatus 01 further comprises: a silicone rubber upper heating disk 130 at a side of the suction sub-column 110 facing the bearing sub-column 210; and/or, a silicone rubber lower heating disk 220 at a side of the bearing sub-column 210 facing the suction sub-column 110.

Here, the silicone rubber material will remain a certain flexibility, elastic resilience and surface hardness even if in a high temperature environm displacing ent higher than 200° C., thus it may match with the curvature of the packaging cover plate 02 and/or the substrate 03 to be packaged very well.

Further, the seal glue 04 on the substrate 03 to be packaged may also employ ultraviolet light cured type, thus, as shown in FIG. 1a, the packaging apparatus 01 further comprises an ultraviolet lamp source 70. An ultraviolet light from the ultraviolet lamp source 70 passes through the upper sealing unit 10 to illuminate on the packaging cover plate 02.

Here, the upper sealing unit 10 can be formed from, for example, quartz material through which the ultraviolet light can penetrate and may not absorb the ultraviolet light, so that the ultraviolet light from the ultraviolet lamp source may pass through the upper sealing unit 10 to illuminate on the packaging cover plate 02.

It should be noted that, all the drawings in the present invention are only simplified schematic views of the above packaging apparatus in order to describe clearly structures associated with inventive concepts of the present invention. Other structures which are not associated with inventive concepts of the present invention belong to existing structures and are not embodied or only a part thereof is embodied in the drawings.

The above are merely the specific implementations of the present invention. However, the scope of the present invention is not limited to this, any change or alternative readily envisaged by those skilled in the art within the scope of the present invention should be also included in the scope of the present invention. Therefore, the scope of the present invention shall be defined in the claims.

What is claimed is:

1. A packaging apparatus comprising:
    an upper sealing unit and a lower sealing unit each having a recess and each is movable towards the other to engage and form a cavity, wherein upper suction columns for fixing a packaging cover plate are disposed inside the recess of the upper sealing unit and a bearing platform for bearing a substrate to be packaged is disposed inside the recess of the lower sealing unit, and seal glue is disposed on a face of the substrate to be packaged facing the packaging cover plate;
    a suction mechanism for vacuumizing the cavity;
    a leveling mechanism for adjusting a levelness of the packaging cover plate and/or the substrate to be packaged;
    a displacing mechanism for driving the packaging cover plate and/or the substrate to be packaged to move towards each other so that the packaging cover plate contacts the seal glue; and
    an inflation mechanism for filling gas into the cavity after vacuumizing,
    wherein, the upper sealing unit further comprises an upper heating disk located in the recess, and the upper suction columns are movable through the upper heating disk in the vertical direction.

2. The packaging apparatus of claim 1, wherein,
    the packaging apparatus further comprises a first driving unit located at a side of the upper sealing unit away from the recess, the first driving unit is used to drive the upper sealing unit to engage with the lower sealing unit to form the cavity.

3. The packaging apparatus of claim 2,
    wherein, the packaging cover plate is located at a side of the upper heating disk facing the lower sealing unit, and vertical movement of the upper heating disk causes vertical movement of the packaging cover plate.

4. The packaging apparatus of claim 3, wherein,
    a suction disk is disposed at a side of the upper suction column away from the upper heating disk and is used to fix the packaging cover plate conveyed to a region between the upper and lower sealing units.

5. The packaging apparatus of claim 4, wherein, the recess of the upper sealing unit consists of an upper recess bottom and upper side walls around the upper recess bottom;
    the packaging apparatus further comprises:
    a supporting platform of the upper suction column located at a side of the upper sealing unit away from the recess and passing along the first driving unit;
    a second driving unit driving the supporting platform of the upper suction column to move in the vertical direction;
    wherein, the upper suction column passes through the upper recess bottom to connect with the supporting platform of the upper suction column and its height is larger than a height of the upper side wall.

6. The packaging apparatus of claim 5, wherein, the packaging apparatus further comprises:
    a supporting platform of the upper heating disk located inside the upper recess bottom and passing along the upper suction column;
    the displacing mechanism comprises:
    a third driving unit driving the supporting platform of the upper heating disk to move in the vertical direction and passing through the supporting platform of the upper suction column and the upper recess bottom; and
    supporting columns of the upper heating disk connecting the supporting platform of the upper heating disk with the upper heating disk.

7. The packaging apparatus of claim 3, wherein, the bearing platform comprises a lower heating disk fixed in the recess;
    the substrate to be packaged is located at a side of the lower heating disk facing the upper sealing unit.

8. The packaging apparatus of claim 7, wherein, the packaging apparatus further comprises lower suction columns which are movable through the lower heating disk in the vertical direction;
    the lower suction columns carry the substrate to be packaged conveyed to the region between the upper and lower sealing units.

9. The packaging apparatus of claim 8, wherein, the recess of the lower sealing unit consists of a lower recess bottom and lower side walls around the lower recess bottom;

the packaging apparatus further comprises: a supporting platform of the lower suction column located at a side of the lower sealing unit away from the recess, and a fourth driving unit driving the supporting platform of the lower suction column to move in the vertical direction;

wherein, the lower suction column passes through the lower recess bottom to connect with the supporting platform of the lower suction column and its height is larger than a height of the lower side wall.

10. The packaging apparatus of claim 4, wherein, the leveling mechanism comprises an upper leveling unit;

the upper leveling unit is located between the upper suction column and the suction disk and comprises an upper levelness adjusting layer and an upper piezoelectric sensing layer with the upper levelness adjusting layer located next to the ends of the upper suction column.

11. The packaging apparatus of claim 8, wherein, the leveling mechanism comprises a lower leveling unit;

the lower leveling unit is located at a side of the lower suction column away from the recess and comprises a lower levelness adjusting layer, a lower piezoelectric sensing layer and a surface suction layer positioned in sequence with the lower levelness adjusting layer next to the ends of the lower suction column.

12. The packaging apparatus of claim 1, wherein, in a state that the packaging cover plate and the substrate to be packaged have a structure of curved surface, each upper suction column comprises a plurality of suction sub-columns with different heights which match with a curvature of the packaging cover plate; and the bearing platform comprises a plurality of bearing sub-columns with different heights which match with a curvature of the substrate to be packaged.

13. The packaging apparatus of claim 12, wherein, the packaging apparatus further comprises:
a silicone rubber upper heating disk at the ends of the suction sub-column facing the bearing sub-column; and/or
a silicone rubber lower heating disk at the ends of the bearing sub-column facing the suction sub-column.

14. The packaging apparatus of claim 7, wherein, the packaging apparatus further comprises a temperature control unit connected to the upper heating disk and/or the lower heating disk.

15. The packaging apparatus of claim 13, wherein, the packaging apparatus further comprises a temperature control unit connected to the upper heating disk and/or the lower heating disk.

16. The packaging apparatus of claim 1, wherein, a seal ring is disposed in a region where the upper sealing unit engages with the lower sealing unit.

17. The packaging apparatus of claim 12, wherein, a seal ring is disposed in a region where the upper sealing unit engages with the lower sealing unit.

18. The packaging apparatus of claim 1, wherein, the packaging apparatus further comprises an ultraviolet lamp source;
an ultraviolet light from the ultraviolet lamp source passes through the upper sealing unit to illuminate on the packaging cover plate.

19. The packaging apparatus of claim 12, wherein, the packaging apparatus further comprises an ultraviolet lamp source;
an ultraviolet light from the ultraviolet lamp source passes through the upper sealing unit to illuminate on the packaging cover plate.

20. The packaging apparatus of claim 7, wherein, the upper heating disk and/or the lower heating disk consists of a plurality of sheet heating strips arranged in parallel and a circuit board.

* * * * *